United States Patent
Kwong et al.

(10) Patent No.: US 7,327,199 B1
(45) Date of Patent: Feb. 5, 2008

(54) PHASE-LOCKED LOOP (PLL) DEVICE AND METHOD FOR ENTERING A TEST MODE WITHOUT A DEDICATED TEST PIN

(75) Inventors: David Kwong, Fremont, CA (US); Trung Tran, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 124 days.

(21) Appl. No.: 11/233,963

(22) Filed: Sep. 23, 2005

Related U.S. Application Data (60) Provisional application No. 60/612,645, filed on Sep. 23, 2004.

(51) Int. Cl.
*G01R 35/00* (2006.01)
(52) U.S. Cl. .......................... 331/44; 324/523; 702/106
(58) Field of Classification Search ................ 324/523; 702/106; 331/44
See application file for complete search history.

(56) References Cited

U.S. PATENT DOCUMENTS 6,420,880 B1 *  7/2002  Miller ........................ 324/537
7,132,835 B1 * 11/2006  Arcus ........................ 324/523

* cited by examiner

*Primary Examiner*—Robert Pascal
*Assistant Examiner*—James Goodley
(74) *Attorney, Agent, or Firm*—Kevin L. Daffer; Daffer McDaniel, LLP (57) ABSTRACT

According to one embodiment, a phase-locked loop (PLL) device includes test circuitry for entering/exiting a test mode upon receiving a particular pulse train at a reference clock input of the PLL. In addition, exemplary methods are provided herein for entering a test mode and detecting loop filter leakage within the PLL. The methods described herein are performed without the use of a dedicated test pin.

21 Claims, 3 Drawing Sheets

PHASE-LOCKED LOOP (PLL) DEVICE AND METHOD FOR ENTERING A TEST MODE WITHOUT A DEDICATED TEST PIN

PRIORITY APPLICATION

This application claims priority to provisional application No. 60/612,645 entitled "Method to Test PLL Loop Filter Leakage Using Only Reference Clock Input," filed Sep. 23, 2004 and incorporated herein in its entirety.

BACKGROUND OF THE INVENTION

1. Field of the Invention

This invention relates to phase-locked loop (PLL) devices and, more particularly, to a method for entering a test mode and detecting loop filter leakage within the PLL without using a dedicated test pin.

2. Description of the Related Art

The following descriptions and examples are given as background only.

Phase-locked loops (PLLs) are routinely used for data and telecommunications, frequency synthesis, clock recovery, and similar applications. In some cases, PLLs may be used in the input/output (I/O) interfaces of digital integrated circuits to hide clock distribution delays and to improve overall system timing. Regardless of application, a PLL may generally be used for generating one or more clocking signals, which are in phase and/or frequency alignment with a reference clock signal.

Figure 1:
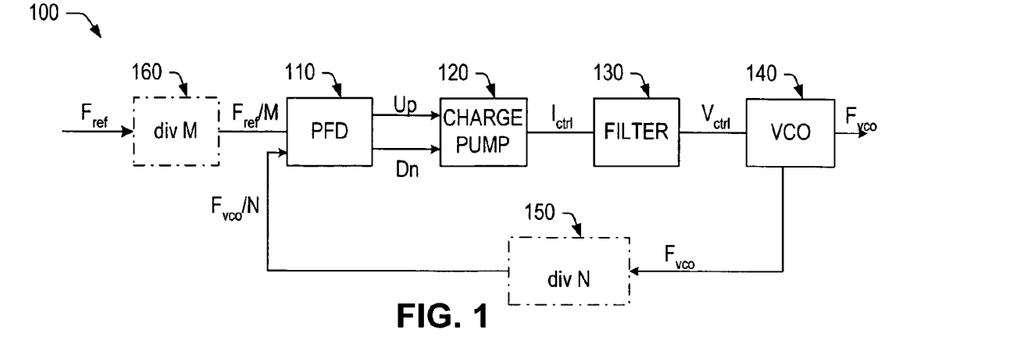
FIG. 1 is a block diagram of an exemplary phase-locked loop (PLL) device.

More specifically, a PLL is a closed-loop device that utilizes a voltage-controlled oscillator (VCO) for obtaining accurate phase and frequency alignment between two signals, typically referred to as feedback and reference clock signals. As shown in FIG. 1, conventional PLLs generally include four main components: a phase frequency detector (PFD) 110, a charge (or voltage) pump 120, a loop filter 130 and a voltage controlled oscillator (VCO) 140. In some cases, frequency dividers 150 and/or 160 may be included for dividing the frequencies of the feedback ($F_{VCO}$) and reference ($F_{REF}$) clock signals.

During operation of the PLL, the PFD monitors the phase/frequency difference between an externally-provided reference signal and the feedback signal generated by the VCO, and as a result, generates compensating "up" and "down" control signals when the feedback signal lags or leads the reference frequency or phase. The up/down control signals are passed through the charge pump and filter to produce a control voltage ($V_{CTRL}$) for controlling the VCO. The control voltage drives the VCO (by increasing/decreasing the oscillation frequency therein) to maintain a predetermined phase relationship between the reference and feedback signals. In this manner, the PLL may be ideally configured for generating one or more output signals, which demonstrate a relatively low (and preferably zero) static phase offset from the reference clock signal at the lock point.

As shown in FIG. 1, one of the frequencies ($F_{VCO}$) output from the VCO may be fed back to the PFD as a feedback signal ($F_{FB}$). If frequency divider 150 is included, PLL 100 may function as a frequency multiplier. For example, frequency divider 150 may be used to produce the feedback signal ($F_{VCO}/N$) by dividing the VCO output frequency by an integer value (N). As noted above, however, frequency divider 150 may not be included in all embodiments.

Circuit designers and manufactures constantly strive to improve the accuracy, reliability and quality of PLL devices. One problem affecting all three characteristics is the occurrence of current leakage within the PLL. Many of the components within a PLL contribute to the current leakage problem including, but not limited to, the PFD, charge pump, loop filter and VCO. At some levels, current leakage within the PLL may result in unwanted spurious spectrum, degraded cycle-to-cycle jitter and frequency drift. In the extreme case, current leakage within the PLL may cause system failure and customer-return, a condition that is undesirable for obvious reasons.

Therefore, a production test is needed to screen for current leakage within each PLL device before that device is shipped to a customer. In some cases, a standard standby current test may be used in a post-production phase for detecting current leakage within a PLL. The standby current test is generally conducted with the PLL in a power down test mode and may be used for detecting current leakage within the PFD, charge pump and/or VCO portions of the PLL. The standby current test is generally sensitive to leakage currents within the micro-amp ($\mu A$) range.

However, a problem arises when one attempts to measure the amount of current leakage attributed to loop filter 130. Because loop filter leakage is so small (generally on the order of nA), it is usually masked out by leakage from other on-chip circuitry, and therefore, cannot be detected by the standard standby current test.

In the past, circuit designers and manufacturers have opted to either (i) add one or more dedicated test pins and associated test circuitry to the PLL device for detecting loop filter leakage, or (ii) not screen for loop filter leakage and accept the risk of this defect. If a dedicated test pin is added, the circuit designer or manufacturer may perform the loop filter leakage test at the package level or at the wafer level. In some cases, a Serial Data Interface and associated logic (e.g., I$^2$C interface and logic) may be used to enter into such a test.

However, the conventional solutions described above are often undesirable for several reasons. For example, disadvantages of the conventional solutions include: (i) the additional cost of adding one or more dedicated test pins to the package, (ii) the high cost of performing wafer-level testing, and/or (iii) the fact that standard test logic (such as I$^2$C logic) is not always available on all products. In addition, each solution increases the cost of manufacturing, and as such, may be unsuitable for low cost products. Furthermore, most manufacturers would agree that the risk of parts being shipped to customers with this reliability problem is highly undesirable. Therefore, opting out of the loop filter leakage test is usually not considered a viable option.

For at least the reasons set forth above, it would be desirable to have an inexpensive test for loop filter leakage that does not require dedicated test pin(s), wafer-level testing or standard test logic.

SUMMARY OF THE INVENTION

The following description of various embodiments of communication networks and methods is not to be construed in any way as limiting the subject matter of the appended claims.

According to one embodiment, a method is provided herein for entering a test mode in a phase-locked loop (PLL) without the use of a dedicated test pin. For example, the method may begin by supplying a power supply voltage ($V_{ps}$) to the PLL to initiate operation thereof. Next, the method may supply a number of consecutive reference clock pulses to the PLL, such that a high voltage level (VOH) of the pulses is greater than the power supply voltage by a predetermined amount. In most cases, the step of supplying a number of consecutive reference clock pulses to the PLL is performed only if the PLL achieves phase-lock after operation is initiated.

As used herein, a "high voltage pulse" may be described as a pulse, whose peak voltage level (VOH) is greater than the power supply voltage ($V_{ps}$) supplied to the PLL. In one example, the high voltage level may be approximately one threshold voltage (1 VT) greater than the power supply voltage, where VT is the threshold voltage of an NMOS transistor. In another example, the high voltage level may be approximately two threshold voltages (2 VTs) greater than the power supply voltage. In yet another example, the high voltage level may be selected from a range of voltages comprising about 0.5 V to about 2.5 V greater than the power supply voltage. For example, a "high voltage pulse" may have a peak voltage level selected from a range of voltages comprising about 1.5 V to 4.5 V (or greater).

Next, the method may include counting the number of consecutive reference clock pulses supplied to the PLL at the high voltage level. In some cases, the PLL may enter (i) a test mode if the count reaches a predefined number, or (ii) a normal mode of operation if the predefined number is not reached. In some cases, the step of counting may also include counting the number of reference clock pulses supplied to the PLL at any voltage level. In such a case, the step of entering the test mode may be performed only if the number of reference clock pulses supplied to the PLL at the high voltage level and at any voltage level are the same and equal to the predefined number.

According to another embodiment, a method is provided herein for detecting an unacceptable amount of leakage within a signal path of a phase locked loop (PLL). In most cases, a method for entering a test mode is performed, as described above. For example, the method may generally include counting a number of high voltage pulses supplied to a reference clock pin of the PLL, and entering a test mode, if the count reaches a first predefined number, N1. Similar to the method described above, the current method is also performed using the reference clock input pin, and thus, eliminates the requirement for an extra test pin.

After a test mode is entered, as described above, the method for detecting leakage may include disconnecting a charge pump portion of the PLL from the signal path, and supplying a number of low voltage pulses to the reference clock pin of the PLL to enable a detection phase. As used herein, a "low voltage pulse" may be described as a pulse, whose peak voltage level (VOH) is substantially less than that of the high voltage pulses. A "low voltage pulse" may also be described as the voltage level at which pulses are typically supplied to the reference clock pin during normal operation of the PLL (i.e., when the charge pump portion is connected to the signal path). In one example, a "low voltage pulse" may have a peak voltage level of about 3.3 V, 2.5 V or lower.

Next, the method may include monitoring an output frequency of the PLL during the detection phase. In some cases, an unacceptable amount of leakage may be detected within the signal path of the PLL, if the output frequency of the PLL during the detection phase is at least 50% lower than an output frequency of the PLL during a normal mode of operation. If the output frequency of the PLL during the detection phase is greater than 50%, the method may detect an acceptable amount of leakage.

During the detection phase, the method may also include counting the number of low voltage pulses supplied to the reference clock pin of the PLL, and exiting the test mode when the number of low voltage pulses reaches a second predefined number, N2. At such time, the charge pump portion of the PLL may be reconnected to the signal path to resume normal operation.

According to another embodiment, a phase-locked loop (PLL) device is provided herein. In general, the PLL may include a phase comparator, a charge pump, a loop filter and a voltage controlled oscillator (VCO). As described in more detail below, the charge pump may be switchably coupled to a signal path extending between a reference clock pin and an output pin of the PLL. The PLL may also include a lock detect circuit coupled for receiving feedback clock pulses from the VCO and reference clock pulses from the reference clock pin. In some cases, the lock detect circuit may be configured for generating a lock signal when the feedback clock pulses are substantially equal in phase to the reference clock pulses.

In addition, test circuitry may be coupled to the reference clock pin of the PLL. In a general embodiment, the test circuitry may be configured for: (i) disconnecting the charge pump from the signal path after a predetermined number of high voltage pulses are supplied to the reference clock pin as reference clock pulses, and (ii) reconnecting the charge pump to the signal path after a predetermined number of low voltage pulses are supplied to the reference clock pin as reference clock pulses.

In a particular embodiment, the test circuitry may include a high voltage pulse detect (HVPD) circuit, test mode logic, a SET-RESET latch, a RESET counter and a switch. The HVPD circuit may be configured for generating an output pulse in response to each high voltage pulse supplied to the reference clock pin. The test mode logic may be configured for counting the number of output pulses generated by the HVPD circuit and enabling a test mode once the number reaches a predefined count.

In general, the test mode logic may include a first counter and a first logic gate. The first counter may have X number of bits and may be configured for counting the number of output pulses generated by the HVPD circuit. The first logic gate may be configured for enabling the first counter to begin counting upon receiving the lock signal from the lock detect circuit.

In some cases, the test mode logic may also include a second counter and a second logic gate. Like the first counter, the second counter may also have X number of bits. However, the second counter may be configured for counting the number of reference clock pulses supplied to the reference clock pin, regardless of the voltage level at which they are supplied. The second logic gate may be configured for enabling the second counter to begin counting upon receiving the lock signal from the lock detect circuit.

In some cases, the test mode logic may also include a third logic gate coupled to the first and second counters and configured for generating a SET signal, if the first and second counters reach the same terminal count value at substantially the same time. In this manner, the test mode logic may prevent the PLL from accidentally entering the test mode during normal operation by requiring that the first and second counters reach the same terminal count value at substantially the same time.

Unlike the first and second counters, the RESET counter (i.e., a third counter) may have Y number of bits, wherein the number of bits, Y, is substantially greater than the number of bits, X, in the first and second counters. Upon receiving a SET signal from the test mode logic, the RESET counter may be configured for: (i) counting the number of reference clock pulses supplied to the reference clock pin, regardless of the voltage level at which they are supplied, and (ii) generating a RESET signal upon reaching a respective terminal count value (associated with the number of bits Y).

The switch may be coupled to the test mode logic and the RESET counter (via the SET-RESET latch). As such, the switch may be configured for: (i) disconnecting the charge pump from the signal path and entering a test mode upon receiving the SET signal, and (ii) reconnecting the charge pump to the signal path and exiting the test mode upon receiving the RESET signal. Unlike conventional test solutions, however, the test circuitry described herein does not include a dedicated test pin for entering/exiting a test mode.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
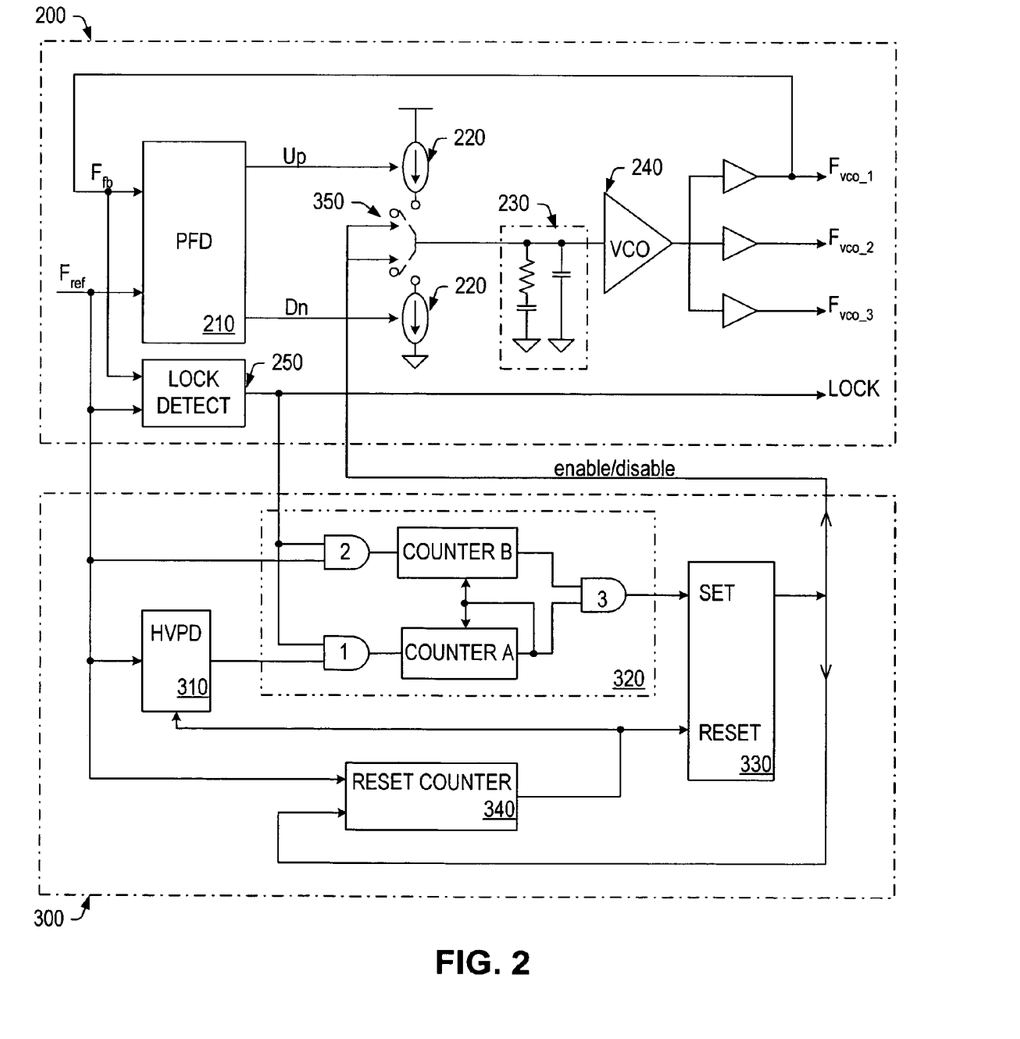
FIG. 2 is a block diagram of a PLL and associated test circuitry for detecting loop filter leakage.

An embodiment of an improved loop filter leakage test solution is shown in FIG. 2. More specifically, FIG. 2 shows a block diagram of a phase-lock loop (PLL) 200 with associated test circuitry 300 for detecting loop filter leakage. Similar to the embodiment shown in FIG. 1, the PLL of FIG. 2 comprises a phase frequency detector (PFD) 210, a charge pump 220, a loop filter 230, and a voltage controlled oscillator (VCO) 240. In some cases, PLL 200 may include frequency dividers in the reference and/or feedback paths of the circuit, as shown in the embodiment of FIG. 1. However, such dividers are not always necessary to the operation of PLL 200, and therefore, are omitted for purposes of brevity.

The operation of PLL 200 is also similar to the operation of PLL 100. For example, during operation of the PLL, a reference clock signal ($F_{ref}$) may be supplied to the phase frequency detector (PFD) 210 from an external clock source (not shown). Once example of an external clock source is a crystal oscillator; however, substantially any stable clock source may be used. After the reference clock signal is received, the PFD monitors the phase/frequency difference between the reference signal and a feedback signal ($F_{fb}$) generated by VCO 240, and generates compensating "up" and "down" control signals when the feedback signal lags or leads the reference frequency or phase. The up/down control signals are passed through the charge pump and filter to produce a control voltage ($V_{CTRL}$) for controlling the VCO. The control voltage drives the VCO by increasing or decreasing the oscillation frequency therein. One of the VCO output signals (e.g., $F_{VCO\_1}$, $F_{VCO\_2}$, or $F_{VCO\_3}$) is fed back to the PFD as a new feedback signal, and the process continues until the generated clocking signals are "in phase" with the reference clock signal.

As used herein, two clocking signals are said to be "in phase" or to have achieved "phase lock" when the phase of one signal is aligned with, or substantially identical to, the phase of another signal being compared therewith. In addition, the "phase" of a signal may be generally described as the direction (e.g., lag or lead) in which the signal is pulling away from a lock point, or zero phase offset position, associated with the PLL.

As shown in FIG. 2, lock detect circuit 250 may be included within PLL 200 for generating a LOCK signal, once phase lock is achieved between the reference and feedback clock signals. Although the frequency of the reference clock signal may sometimes change (e.g., due to slight fluctuations within the external clock source), the LOCK signal may remain asserted (e.g., logic 1) as long as the feedback clock signal(s) remain in phase with the reference clock signal. Lock detect circuit 250 may be implemented in any manner known in the art.

Loop filter 230 is shown in FIG. 2 as a parallel combination of resistive and capacitive components. However, loop filter 230 is not limited to the particular implementation shown in FIG. 2 and may, instead, be implemented with substantially any low-pass filter design. Regardless of design, some amount of current leakage may be present within the loop filter. As noted above, such leakage may reduce the overall performance of the PLL by degrading the cycle-to-cycle jitter and/or causing the VCO output frequency to drift away from the reference clock frequency. In some cases, loop filter leakage may cause a PLL product to fall short of certain design specifications (e.g., loop filter leakage may cause the PLL to miss a 200 ps max jitter specification by increasing the cycle-to-cycle jitter to about 2 ns). In other cases, loop filter leakage may cause the PLL to fail by not allowing the PLL to achieve phase lock. Regardless, most manufacturers would agree that shipping a product to a customer without testing for loop filter leakage is not a viable option. For example, unreliable and/or inaccurate products may be returned by the customer, causing the manufacturer to lose business and/or consumer confidence.

Figure 3:
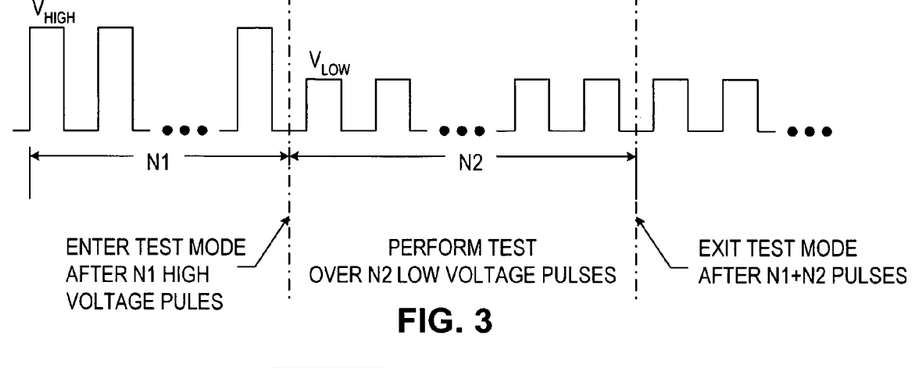
FIG. 3 shows a timing diagram for operation of the loop filter leakage test mode.
Figure 4:
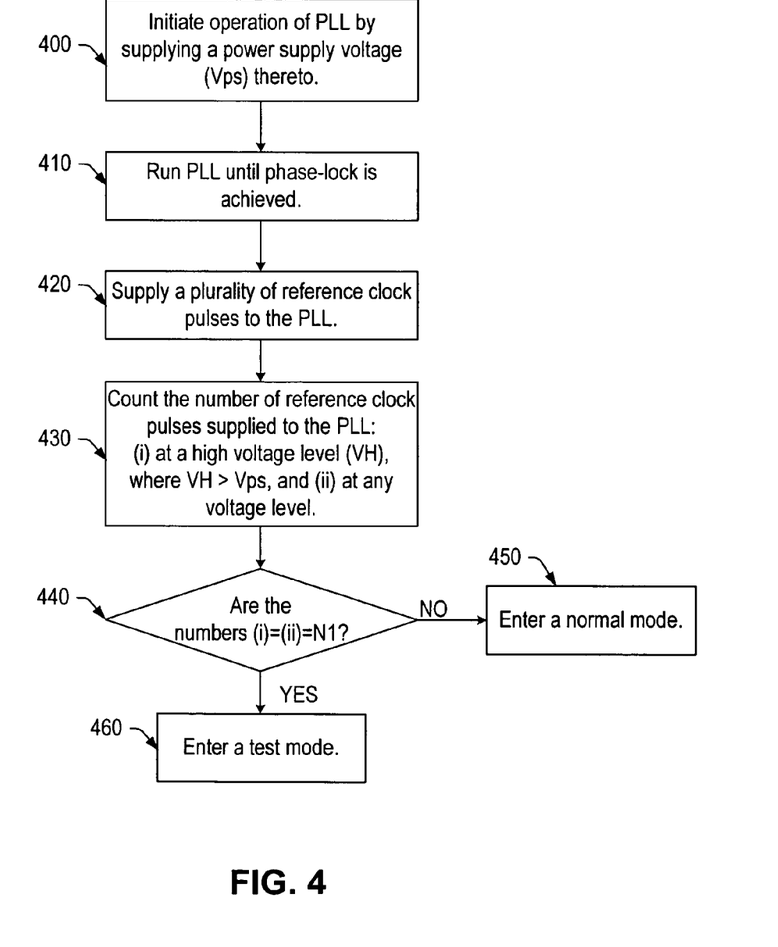
FIG. 4 is a flow chart diagram illustrating an exemplary method for entering a test mode in a PLL.

An improved test circuit and methods for detecting loop filter leakage are shown in FIGS. 2-5. More specifically, the test circuitry shown in FIG. 2 and the method shown in FIG. 4 provide an improved means for entering a loop filter test mode without the use of a dedicated test pin. The method shown in FIG. 5 describes one manner in which a loop filter leakage test may be performed after the test mode is entered.

As shown in FIG. 2, test circuitry 300 may generally include a high voltage pulse detect (HVPD) circuit 310, test mode logic 320, SET-RESET latch 330, reset counter 340 and switch 350. The general function of the test circuitry is to disconnect the charge pump from the loop filter upon receiving a disabling signal. Once the charge pump is disconnected, a test mode may be entered for detecting loop filter leakage by checking for frequency drift at the outputs of the PLL.

The test circuitry shown in FIG. 2 provides a unique means for entering a test mode without the use of a dedicated test pin or standard test logic. Contrary to conventional test solutions, the present design conserves cost by using the pre-existing reference clock pin to enter the test mode. As described in more detail below, a test mode may be entered by supplying a particular pulse train to the reference clock pin. Reference will now be made to FIGS. 2-4 to describe one manner in which the test circuitry 300 may be used to enter into a test mode.

As shown in FIG. 2, the reference clock ($F_{ref}$) and the feedback clock ($F_{fb}$) signals are supplied to the lock detect circuitry 250. As noted above, the lock detect circuitry 250 is configured for generating a LOCK signal after the PLL is powered up and locked to a stable frequency. In some cases, the LOCK signal may transition from a low level (e.g., logic 0 level) to a high level (e.g., logic 1 level) to indicate that the PLL is locked. However, the opposite may be true, in other cases. Regardless, the LOCK signal may be supplied to test mode logic 320 to indicate that the PLL is locked and ready for testing.

In addition to lock detect circuitry 250, the reference clock ($F_{ref}$) signal is supplied to the inputs of test mode logic 320 and to the high voltage pulse detect (HVPD) circuit 310. In one embodiment, test mode logic 320 may include a first counter (e.g., counter A) having X number of bits, and a first logic gate (e.g., AND gate 1) for enabling/disabling the first counter based on a logic level of the LOCK signal. Once enabled, the first counter may be configured for counting a number of high voltage pulses supplied to the reference clock pin. As used herein, "high voltages pulses" are pulses which have a significantly higher voltage level than the normal operating level of the PLL. In one example, a "high voltage pulse" may be described as a pulse, whose peak voltage level (VOH) is greater than the power supply voltage ($V_{ps}$) supplied to the PLL.

The high voltage pulse detect (HVPD) circuit 310 is configured for monitoring the input pulses supplied to the reference clock pin and for generating an output pulse for each input pulse, which is greater than the power supply voltage. In some cases, an output pulse may be generated for every input pulse, which exceeds the power supply voltage by about 1-2 VTs (where VT is the voltage threshold of an NMOS transistor). Such input pulses may be referred to herein as "high voltage pulses". In other cases, the high voltage pulses may exceed the power supply voltage by an amount substantially less than or greater than 1-2 VTs. As shown in FIG. 2, the output of the HVPD circuit is fed into the first logic gate (e.g., AND gate 1) within test mode logic 320. Once the LOCK signal is received from lock detect circuitry 250, AND gate 1 will enable counter A to begin counting the number of output pulses generated by HVPD circuit 310.

In a preferred embodiment of the invention, HVPD circuit 310 may also include glitch elimination circuitry. For example, HVPD circuit 310 may include a built-in minimum pulse width glitch-protection circuit for removing any "glitches" that may occur in the reference clock signal (e.g., as a result of overshoot noise). An exemplary glitch-elimination circuit can be found in "Itanium Process System Bus Design," Alper Ilkbahar et al., JSSC, Vol. 36, No. 10, October 2001. Regardless of the particular glitch elimination circuit used, the addition of such a circuit may prevent the PLL from accidentally entering a test mode when the reference input is "glitchy."

Additional means for preventing the PLL from accidentally entering the test mode may also be included within test mode logic 320. As shown in FIG. 2, for example, test mode logic 320 may include a second counter (e.g., counter B), also having X number of bits, and a second logic gate (e.g., AND gate 2) for enabling/disabling the second counter based on a logic level of the LOCK signal. Once enabled, the second counter may be configured for counting the number of pulses supplied to the reference clock pin, regardless of the voltage level at which they are supplied. Thus, in a preferred embodiment of the invention, test mode logic 320 may include two substantially identical counters (i.e., counters A and B), each with X number of bits. One of the counters (counter A) may be used for counting only high voltage pulses, while the other counter (counter B) is used for counting all pulses supplied to the reference clock input.

During a test mode initiation sequence, counters A and B are incremented with every high voltage pulse supplied to the reference clock pin. Once a terminal count value is reached, counters A and B will issue an output signal to a third logic gate (e.g., AND gate 3). If the output signals from both counters are issued at the same time, test mode logic 320 will output a signal to SET the output of the SET-RESET latch 330 (e.g., to logic "1"). The output signal from the SET-RESET latch (i.e., the disabling signal) may then be supplied to switch 350 for disconnecting the charge pump from the loop filter to prepare for the loop filter leakage test.

During normal operation of the PLL, the two substantially identical counters prevent false triggering of the test mode by ensuring that the test mode is entered only after a consecutive number of high voltage pulses are received. For example, assume that counters A and B are both 3-bit counters, each configured for counting up to 7 pulses. During normal operation, most (if not all) of the pulses supplied to the reference clock input will be of a normal operating level (e.g., a voltage level substantially equal to the power supply voltage). In some cases, occasional glitches from the reference clock (or other voltage level disturbances) may cause one or more reference clock pulses to register as a "high voltage pulse." However, because counter A is configured for counting only high voltage pulses, while counter B is configured for counting all pulses, the counters will not reach a terminal count value (e.g., 7) at the same time, unless all pulses are "high voltage pulses." The requirement for counters A and B reaching the terminal count value at the same time is satisfied by clearing both counters as soon as counter B reaches it's terminal count value.

As shown in FIG. 2, the reference clock input is also coupled to the input of a third counter 340 having Y number of bits. This third counter is referred to herein as the RESET counter and is activated only after the charge pump has been disconnected from the loop filter (after the PLL has entered the test mode). Once the test mode is entered, RESET counter 340 will increment upon receiving each new pulse from the reference clock pin. The PLL may be tested for loop filter leakage during this time, as described below in reference to FIG. 5. After the RESET counter reaches a specified number of counts (i.e., a terminal count value associated with the Y number of bits), RESET counter 340 will issue an output signal to RESET the output of the SET_RESET latch 330. The output signal from the SET-RESET latch (i.e., the enabling signal) is supplied to switch 350 for exiting the test mode and re-connecting the charge pump to the loop filter. In some cases, the RESET signal may also be supplied to the high voltage pulse detect circuit 310 for disabling the HVPD circuit and preventing the test mode circuit from being activated during normal operation of the PLL.

In the embodiment of FIG. 2, PLL 200 is configured for entering a test mode only after (i) the PLL is locked, and (ii) test circuitry 300 detects a pre-determined number (N1) of consecutive high voltage pulses supplied to the reference clock pin. As noted above, "high voltage pulses" are pulses that have a high level voltage (VOH) significantly higher than the normal operating level. In one exemplary embodiment, a test mode may be entered if a train of sixty-four 4.5V pulses are supplied to the reference clock pin of a PLL, which normally operates at about 2.5V. In this particular example, counters A and B would each include 6 bits for counting up to a terminal count value of 64. However, it should be understood that the number of high voltage pulses used to enter a test mode is determined by a trade-off. For example, a PLL is less likely to enter into a test mode by accident when a larger count value, rather than a smaller count value, is used. However, larger count values require more bits, and thus, necessitate more area and cost. In one preferred embodiment, counters A and B would each include 3 bits to minimize cost and size.

Figure 5:
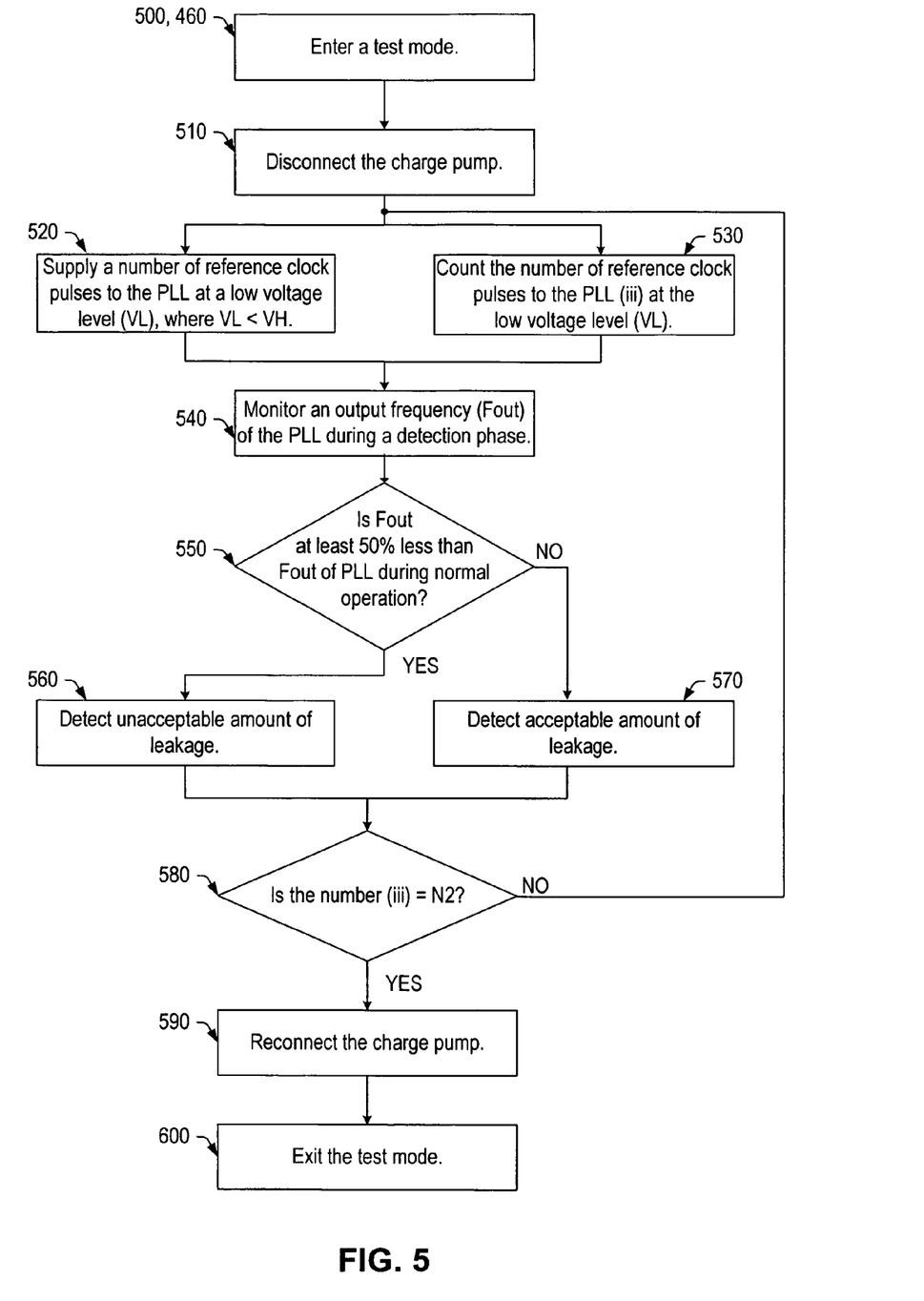
FIG. 5 is a flow chart diagram illustrating an exemplary method for detecting an unacceptable amount of leakage within a signal path of a PLL.

Once the PLL enters the leakage test mode, the deviation of the test mode frequencies from the normal mode is compared within a pre-determined time interval (as described in reference to FIG. 5). Excessive deviation indicates leakage in the loop filter.

Once the loop filter leakage test is performed, test circuitry 300 may cause PLL 200 to exit the test mode after a pre-determined number (N2) of additional pulses are detected from the reference clock pin. In most cases, the additional pulses are supplied to the reference clock pin at a normal operating level (e.g., a voltage level substantially equal to the power supply voltage). In one exemplary embodiment, the PLL may leave the test mode if a train of 512 2.5V pulses are supplied to the reference clock pin of a PLL, which operates at about 2.5V. In this example, RESET counter 340 would include 9 bits for counting up to a terminal count value of 512. However, it should be understood that the number of normal voltage pulses used to exit the test mode are also bound by a trade-off. In general, the RESET counter should include enough bits for performing the leakage test over a specified period of time (related to the pulse rate), while minimizing cost and area. In one preferred embodiment, RESET counter 340 may include 9 bits for conducting the leakage test over a 100 µsec interval at a pulse rate of 100 ns (10 MHZ) or more.

FIG. 3 shows a timing diagram for operation of the loop filter leakage test mode. FIG. 4 shows a method for entering a test mode, according to one embodiment of the invention. As shown in FIG. 4, an exemplary method for entering a test mode may begin by supplying a power supply voltage ($V_{ps}$) to the PLL to initiate operation thereof (step 400). More specifically, the PLL is powered up and all counters are cleared in step 400. In step 410, the PLL is run until phase-lock is achieved. As noted above, "phase-lock" is achieved when the phase of one signal is aligned with, or substantially identical to, the phase of another signal being compared therewith. Once phase lock is achieved (and a LOCK signal is generated by lock detect circuitry 250), a predetermined number of high voltage pulses may be supplied to the reference clock pin (in step 420), where a "high voltage pulse" is described as a pulse having a voltage high value (VOH) higher than the power supply voltage ($V_{ps}$).

In step 430, the number of high voltage pulses are counted at counter A, while all pulses supplied to the reference clock pin are counted at counter B. In one embodiment, counter A will only be incremented when the high voltage pulses are higher than the power supply voltage by about 1 VT or 2 VTs, where VT is the threshold voltage of an NMOS transistor. Since counter B is incremented upon every pulse (regardless of voltage level), the counters will reach the same terminal count value (N1) at the same time, only if a predetermined number of consecutive high voltage pulses are supplied to initiate the test mode sequence.

If counters A and B do not reach the same terminal count value at the same time (in step 440), the PLL may enter a normal mode of operation (in step 450). However, the PLL may enter a test mode (in step 460) if the terminal count value (N1) is reached by both counters at the same time (in step 440). For example, counters A and B may generate a signal (when they reach the same pre-set terminal count) to SET the output of the SET-RESET latch. This enabling signal may then be used to disconnect the charge pump from the loop filter, enabling the loop filter leakage test.

Although not shown in the embodiment of FIG. 4, both counters A and B will be cleared as soon as counter B reaches its full count. When combined with the AND logic gate at the outputs of counters A and B, the clearing of counter B prevents false triggering of the test mode during normal operation of the PLL. As noted above, the output of the SET-RESET latch will not be SET (to disconnect the charge pump), if there is at least one high voltage pulse missing from the reference clock pulse train (since SET will go high only when counters A and B reach their terminal count at the same time). Thus, occasional glitches from the reference clock will not put the PLL into leakage test mode.

Referring to FIG. 5, an exemplary method for detecting loop filter leakage may begin by entering a test mode (in step 500), as described above in reference to FIG. 4. Upon entering the test mode (in step 500), the charge pump is disconnected from the loop filter (in step 510), and the RESET counter is enabled for counting the number of pulses supplied to the reference clock pin during the detection phase (in steps 520 and 530). Though "normal" level pulses are generally used during this phase, the RESET counter will increment whenever it encounters any pulse from the reference input. Once the RESET counter reaches its terminal count value (N2) in step 580, it will generate a signal to RESET the SET-RESET latch, re-connect the charge pump to the loop filter (in step 590) and de-activate the high voltage pulse detect circuit. This causes the PLL to exit the test mode (in step 600) and, in some cases, prevents the PLL from re-entering the test mode unless the chip is powered-down and powered-up again.

During the detection phase, at least one output frequency of the PLL (e.g., $F_{VCO\_1}$, $F_{VCO\_2}$, or $F_{VCO\_3}$) may be monitored over a predefined interval of time to measure frequency drift (in step 540). In most cases, the predefined interval of time may be determined by the size of the RESET counter, which in turn, may be determined by the size of the loop counter. In one embodiment, the predefined interval of time (or detection phase) may span about 100 µsec or approximately N2=512 reference clock pulses (when the RESET counter includes 9 bits). To measure frequency drift, the output frequencies monitored during the detection phase are compared with those obtained during a normal mode of operation over the same time interval. Excessive deviation between the detection phase and normal mode output frequencies indicates leakage.

In some cases, for example, the method may detect an unacceptable amount of loop filter leakage (in step 560) if the PLL output frequency monitored during the detection phase is at least 50% less than a corresponding output frequency obtained during normal operation (in step 550). Otherwise, an acceptable amount of loop filter leakage may be detected (in step 570). However, it should be understood that an "unacceptable" amount of leakage may be detected by smaller or larger amounts of frequency drift, in other embodiments of the invention.

For purposes of clarity, many of the details of this leakage test and the methods of designing and manufacturing the same that are widely known and are not relevant to the present invention have been omitted from the following description. In addition, although described in the context of a loop filter leakage test, the method for entering a test mode may also be applied to other PLL test parameters (e.g., AC/DC, VOH, VOL test parameters). Unlike conventional test solutions, the method described herein is performed without the use of a dedicated test pin or standard test logic. As such, the method may be used within low cost products and those which do not offer standard test interfaces.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method for entering a test mode in a phase-locked loop (PLL), the method comprising:
   supplying a power supply voltage to the PLL to initiate operation thereof;
   supplying a number of consecutive reference clock pulses to the PLL, such that a high voltage level of the pulses is greater than the power supply voltage by a predetermined amount;
   counting the number of consecutive reference clock pulses supplied to the PLL at the high voltage level, and:
   entering the test mode, if the count reaches a predefined number; or
   entering a normal mode, if the count does not reach the predefined number.

2. The method as recited in claim 1, wherein the high voltage level is approximately one threshold voltage (1 VT) greater than the power supply voltage, where VT is the threshold voltage of an NMOS transistor.

3. The method as recited in claim 1, wherein the high voltage level is approximately two threshold voltages (2 VT) greater than the power supply voltage, where VT is the threshold voltage of an NMOS transistor.

4. The method as recited in claim 1, wherein the high voltage level is selected from a range of voltages comprising about 0.5 V to about 2.5 V greater than the power supply voltage.

5. The method as recited in claim 1, wherein the step of supplying a number of consecutive reference clock pulses to the PLL is performed only if the PLL achieves phase-lock after operation is initiated.

6. The method as recited in claim 1, wherein in addition to counting the number of reference clock pulses supplied to the PLL at the high voltage level, the step of counting comprises counting the number of reference clock pulses supplied to the PLL at any voltage level.

7. The method as recited in claim 6, wherein the step of entering the test mode is performed only if the number of reference clock pulses supplied to the PLL at the high voltage level and at any voltage level are the same and equal to the predefined number.

8. A method for detecting an unacceptable amount of leakage within a signal path of a phase-locked loop (PLL), the method comprising:
   counting a number of high voltage pulses supplied to a reference clock pin of the PLL;
   entering a test mode, if the count reaches a first predefined number N1 wherein upon entering the test mode, the method further comprises:
   disconnecting a charge pump portion of the PLL from the signal path;
   supplying a number of low voltage pulses to the reference clock pin of the PLL to enable a detection phase;
   monitoring an output frequency of the PLL during the detection phase; and
   detecting an unacceptable amount of leakage within the signal path of the PLL, if the output frequency of the PLL during the detection phase is at least 50% lower than an output frequency of the PLL during normal operation.

9. The method of claim 8, wherein a voltage level of the high voltage pulses is substantially greater than a power supply voltage supplied to the PLL, and a voltage level of the low voltage pulses is substantially less than that of the high voltage pulses.

10. The method of claim 9, wherein if the step of entering the test mode is performed, the method further comprises:
    counting the number of low voltage pulses supplied to the reference clock pin of the PLL; and
    exiting the test mode when the number of low voltage pulses reaches a second predefined number, N2.

11. The method of claim 10, wherein the step of exiting the test mode comprises reconnecting the charge pump portion of the PLL to the signal path to resume normal operation.

12. A phase-locked loop (PLL) device, comprising:
    a charge pump switchably coupled to a signal path extending between a reference clock pin and an output pin of the PLL; and
    test circuitry coupled to the reference clock pin and configured for:
    disconnecting the charge pump from the signal path after a predetermined number of high voltage pulses are supplied to the reference clock pin as reference clock pulses; and
    reconnecting the charge pump to the signal path after a predetermined number of low voltage pulses are supplied to the reference clock pin as reference clock pulses.

13. The PLL device as recited in claim 12, wherein a voltage level of the high voltage pulses is substantially greater than a power supply voltage supplied to the PLL, and a voltage level of the low voltage pulses is substantially less than that of the high voltage pulses.

14. The PLL device as recited in claim 13, wherein the PLL device further comprises:
   a phase comparator;
   a loop filter responsive to the phase comparator;
   a voltage controlled oscillator (VCO) responsive to the loop filter; and
   a lock detect circuit coupled for receiving feedback clock pulses from the VCO and reference clock pulses from the reference clock pin, wherein the lock detect circuit is configured for generating a lock signal when the feedback clock pulses are substantially equal in phase to the reference clock pulses.

15. The PLL device as recited in claim 14, wherein the test circuitry comprises a high voltage pulse detector (HVPD) configured for generating an output pulse in response to each high voltage pulse supplied to the reference clock pin.

16. The PLL device as recited in claim 15, wherein the test circuitry further comprises:
   a first counter having X number of bits, wherein the first counter is configured for counting the number of output pulses generated by the detector; and
   a first logic gate configured for enabling the first counter to begin counting upon receiving the lock signal from the lock detect circuit.

17. The PLL device as recited in claim 16, wherein the test circuitry further comprises:
   a second counter also having X number of bits, wherein the second counter is configured for counting the number of reference clock pulses supplied to the reference clock pin, regardless of the voltage level at which they are supplied; and
   a second logic gate configured for enabling the second counter to begin counting upon receiving the lock signal from the lock detect circuit.

18. The PLL device as recited in claim 17, wherein the test circuitry further comprises a third logic gate coupled to the first and second counters and configured for generating a set signal, if the first and second counters reach the same terminal count value at substantially the same time.

19. The PLL device as recited in claim 18, wherein the test circuitry further comprises a third counter having Y number of bits, wherein the number of Y bits is substantially greater than the number of X bits and wherein the third counter is configured for:
   upon receiving the set signal, counting the number of reference clock pulses supplied to the reference clock pin, regardless of the voltage level at which they are supplied; and
   generating a reset signal upon reaching a respective terminal count value, which is preset to occur sometime after the terminal count value of the first and second counters is reached.

20. The PLL device as recited in claim 19, wherein the test circuitry further comprises a switch configured for:
   disconnecting the charge pump from the signal path upon receiving the set signal; and
   reconnecting the charge pump to the signal path upon receiving the reset signal.

21. The PLL device as recited in claim 20, wherein the test circuitry does not include a dedicated test pin for entering/exiting a test mode.

\* \* \* \* \*